US010110253B2

(12) United States Patent
Yamamoto

(10) Patent No.: US 10,110,253 B2
(45) Date of Patent: Oct. 23, 2018

(54) RECEIVER

(71) Applicant: Hitachi Kokusai Electric Inc., Chiyoda-ku, Tokyo (JP)

(72) Inventor: Keisuke Yamamoto, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 15/125,870

(22) PCT Filed: Mar. 3, 2015

(86) PCT No.: PCT/JP2015/056191
§ 371 (c)(1),
(2) Date: Sep. 13, 2016

(87) PCT Pub. No.: WO2015/156058
PCT Pub. Date: Oct. 15, 2015

(65) Prior Publication Data
US 2017/0005673 A1    Jan. 5, 2017

(30) Foreign Application Priority Data

Apr. 8, 2014 (JP) ................................ 2014-079543

(51) Int. Cl.
*H03M 13/27* (2006.01)
*H03M 13/37* (2006.01)
(Continued)

(52) U.S. Cl.
CPC ....... *H03M 13/2792* (2013.01); *H03M 13/25* (2013.01); *H03M 13/27* (2013.01);
(Continued)

(58) Field of Classification Search
CPC .. H03M 13/2792; H03M 13/25; H03M 13/27; H03M 13/2957; H03M 13/3746;
(Continued)

(56) References Cited

U.S. PATENT DOCUMENTS 9,503,855 B2 * 11/2016 Chen .................... H04W 64/00
2010/0146365 A1 * 6/2010 Yano ................... H03M 13/255
714/752

(Continued)

FOREIGN PATENT DOCUMENTS

JP    2008-182332 A    8/2008
JP    2011-223332 A    11/2011

OTHER PUBLICATIONS

International Search Report (PCT/ISA/210) issued in PCT Application No. PCT/JP2015/056191 dated Jun. 2, 2015 with English translation (10 pages).

(Continued)

*Primary Examiner* — Kyle Vallecillo
(74) *Attorney, Agent, or Firm* — Crowell & Moring LLP

(57) ABSTRACT

Provided is a BICM-ID technique which suppresses deterioration of decoding characteristics and reduces a calculation amount. A receiver includes a demodulator, deinterleaver, decoder, and interleaver. The demodulator outputs first extrinsic information by using a received signal encoded and interleaved and a priori information. The deinterleaver processes the first extrinsic information and outputs second extrinsic information. The decoder outputs third extrinsic information by using the second extrinsic information. The interleaver processes the third extrinsic information and outputs fourth extrinsic information. In the receiver that performs iterative decoding processing using the fourth extrinsic information as the a priori information, the demodulator includes a generator, a received signal point candidate narrowing-down unit, and a likelihood calculation unit. The generator generates a plurality of received signal point candidates. The likelihood calculation unit creates the first extrinsic information based on the narrowed-down (Continued)

received signal point candidates, the a priori information, and the received signal.

12 Claims, 7 Drawing Sheets

(51) Int. Cl.
H03M 13/45 (2006.01)
H04L 1/00 (2006.01)
H03M 13/25 (2006.01)
H03M 13/29 (2006.01)
H03M 13/00 (2006.01)
H04B 7/0413 (2017.01)

(52) U.S. Cl.
CPC ... *H03M 13/2957* (2013.01); *H03M 13/3746* (2013.01); *H03M 13/45* (2013.01); *H03M 13/6325* (2013.01); *H04L 1/005* (2013.01); *H04L 1/0045* (2013.01); *H04L 1/0058* (2013.01); *H04L 1/0071* (2013.01); *H04B 7/0413* (2013.01)

(58) Field of Classification Search
CPC . H03M 13/45; H03M 13/6325; H04L 1/0045; H04L 1/005; H04L 1/0058; H04L 1/0071; H04B 7/0413
See application file for complete search history.

(56) References Cited

U.S. PATENT DOCUMENTS

2013/0208836 A1* 8/2013 Yamamoto ............ H04L 1/005
375/341
2015/0358781 A1* 12/2015 Chen .................... H04W 64/00
455/456.1
2016/0087652 A1* 3/2016 Ha ..................... H03M 13/2757
714/755
2016/0277145 A1* 9/2016 Grant .................... H04L 1/0041

OTHER PUBLICATIONS

Japanese-language Written Opinion (PCT/ISA/237) issued in PCT Application No. PCT/JP2015/056191 dated Jun. 2, 2015 (5 pages).
Awater et al. "Reduced Complexity Space Division Multiplexing Receivers", VTC200, Lucent Technologies Bell Labs, 2000 (5 pages).
Viterbo et al. "A Universal Lattice Code Decoder for Fading Channels", IEEE Transactions on Information Theory, vol. 45, No. 5, Jul. 1999, pp. 1639-1642.
Li et al., "Bit-Interleaved Coded Modulation with Iterative Decoding", IEEE Communications Letters, vol. 1, No. 6, Nov. 1997, pp. 169-171.
Brink, "Convergence Behavior of Iteratively Decoded Parallel Concatenated Codes", IEEE Transactions on Communications, vol. 49, No. 10, Oct. 2001, pp. 1727-1737.
Yano et al.,"Arithmetic Extended-Mapping for BICM-ID with Repetition Codes", 2009 International ITG Workshop on Smart Antennas, WSA 2009, Berlin, Germany, Feb. 2009 (8 pages).
Gimmler-Dumont et al. "Reliability Study on System Memories of an Iterative MIMO-BICM System", 2012 IEEE/IFIP 20$^{th}$ International Conference on VLSI and System-on-Chip(VLSI-SOC), Oct. 7-10, 2012, pp. 255-258.
Higashinaka et al, "Reduced Complexity Maximum Likelihood Detection with Soft-Decision Outputs for MIMO Wireless Communication Systems", IEICE Technical Report, Oct. 2005, pp. 37-42, with English Abstract.

* cited by examiner

RECEIVER

TECHNICAL FIELD

The present invention relates to a wireless communication technique for performing iterative decoding processing on information bits encoded and interleaved (bit order exchange) on a transmission side by using a demodulator, a deinterleaver, a decoder, and an interleaver on a receiving side.

BACKGROUND ART

In wireless communication, a multiple input multiple output (MIMO) technique, which improves a communication speed and reliability by using multiple antennas, is used in many systems including a cellular system and a wireless local area network (LAN) system. In the MIMO, a maximum likelihood estimation (ML) method is used as MIMO demodulation processing for estimating an original transmission signal from signals that are output from multiple antennas and mixed in a wireless propagation path. The ML method is known as an optimum demodulation method in the case where there is no a priori information regarding a received signal.

In the ML method, an original signal is estimated by comparing every possible received signal point candidates and a received signal. Therefore, in the case where many antennas are provided or a modulation multilevel number of a transmission signal is large, received signal point candidates are exponentially increased and a calculation amount becomes huge.

In this case, as a method for reducing a processing amount while suppressing deterioration of demodulation characteristics, a method using QR decomposition and M algorism (refer to NPL 1) and a sphere decoding (SD) method (refer to NPL 2) are proposed. In these methods for reducing a calculation amount, the calculation amount is reduced by narrowing received signal point candidates down to those to be used in processing by the ML method.

On the other hand, a technique called BICM-ID (bit interleaved coded modulation with iterative decoding) (refer to NPL 3) is proposed, and it has gained attention. In the BICM-ID, demodulation processing with respect to modulation and a decoding processing with respect to encoding are iteratively performed to realize excellent decoding characteristics. Characteristics of the BICM-ID are not individual characteristics of a demodulator and a decoder and are determined by matching therebetween. In the BICM-ID, convergence characteristics are analyzed by using extrinsic information transfer (EXIT) analysis proposed in NPL 4, and a demodulator and a decoder which realize excellent decoding characteristics can be designed.

NPL 5 discloses a method to provide the BICM-ID, in which a transmission rate loss and a processing amount of a decoder are reduced by encoding by a code on a basis of a repetition code considered to be the simplest code and by performing multilevel modulation using non gray mapping and extension mapping.

CITATION LIST

Non-Patent Literature

NPL 1: "Reduced Complexity Space Division Multiplexing Receives", "VTC200, Lucent Technologies Bell Labs", "2000", written by "Geert Awater, Allert van Zelst, and Richard van Nee"

NPL 2: "A Universal Lattice Code Decoder for Fading Channels", "IEEE Trans. on Inform. Theory, Vol. 45, No. 5, pp. 1639-1642", "July, 1999", written by "E. Viterbo, and J. Boutros"

NPL 3: X. Li and J. A. Ritcey, "Bit-Interleaved Coded Modulation with Iterative Decoding," IEEE Communications Letters, vol. 1, pp. 169171, 1997

NPL 4: S. ten Brink, "Convergence Behavior of Iteratively Decoded Parallel Concatenated Codes," IEEE Transactions on Communications, vol. 49, No. 10, pp. 1727-1737, October 2001

NPL 5: T. Yano and T. Matsumoto, "Arithmetic extended-mapping for BICM-ID with repetition codes," International ITG Workshop on Smart Antennas, W S A 2009, Berlin, Germany, February 2009.

SUMMARY OF INVENTION

Technical Problem

In the case where, for example, MIMO is applied to BICM-ID, a priori information is fed back from a decoder to input of a MIMO demodulator. In the MIMO demodulator, a maximum a posteriori probability (MAP) estimation of demodulator output can be calculated by using the a priori information in addition to a received signal. However, in the case were a modulation multilevel number of a transmission signal is large, received signal point candidates are exponentially increased, and a calculation amount of the MIMO demodulator becomes huge. Further, since demodulation processing is repeated multiple times in the BICM-ID, it is important to reduce a calculation amount of the MIMO demodulator per processing in comparison with a system which does not perform iterative decoding processing.

An object of the present invention is to provide an iterative decoding processing technique which can suppress deterioration of decoding characteristics and reduce a calculation amount in a wireless communication system and a receiver using the BICM-ID (iterative decoding processing).

Solution to Problem

The present disclosure includes a means to solve the above-described issue, and a representative configuration according to the present invention is to be described below. More specifically, the means is a receiver that includes a demodulator configured to receive a signal encoded and interleaved on a transmission side, create first extrinsic information by using the received signal and a priori information, and output the first extrinsic information; a deinterleaver configured to perform deinterleave processing inverse to the interleave processing on the first extrinsic information and output second extrinsic information; a decoder configured to create third extrinsic information by using the second extrinsic information and output the third extrinsic information; and an interleaver configured to perform interleave processing inverse to the deinterleave processing on the third extrinsic information and output fourth extrinsic information, wherein the receiver performs iterative decoding processing by inputting the fourth extrinsic information as the a priori information to the demodulator, the demodulator comprising: a received signal point candidate generator configured to generate a plurality of received signal point candidates; a received signal point candidate narrowing-down unit configured to narrow a plurality of the generated received signal point candidates down to received signal point candidates to be used to create the first extrinsic information from a plurality of the generated received signal point candidates, based on a magnitude of the a priori information and a distance between a plurality of the received signal point candidates generated by the received signal point candidate generator and the signal received by the demodulator; and a likelihood calculation unit configured to create the first extrinsic information based on the narrowed-down received signal point candidates, the a priori information, and the received signal.

Advantageous Effects of Invention

A wireless communication system and a receiver in which BICM-ID (iterative decoding processing) is used can suppress deterioration of decoding characteristics and reduce a calculation amount.

DESCRIPTION OF EMBODIMENTS

First Embodiment

A first embodiment will be described below with reference to FIGS. 1 to 5.

Figure 1:
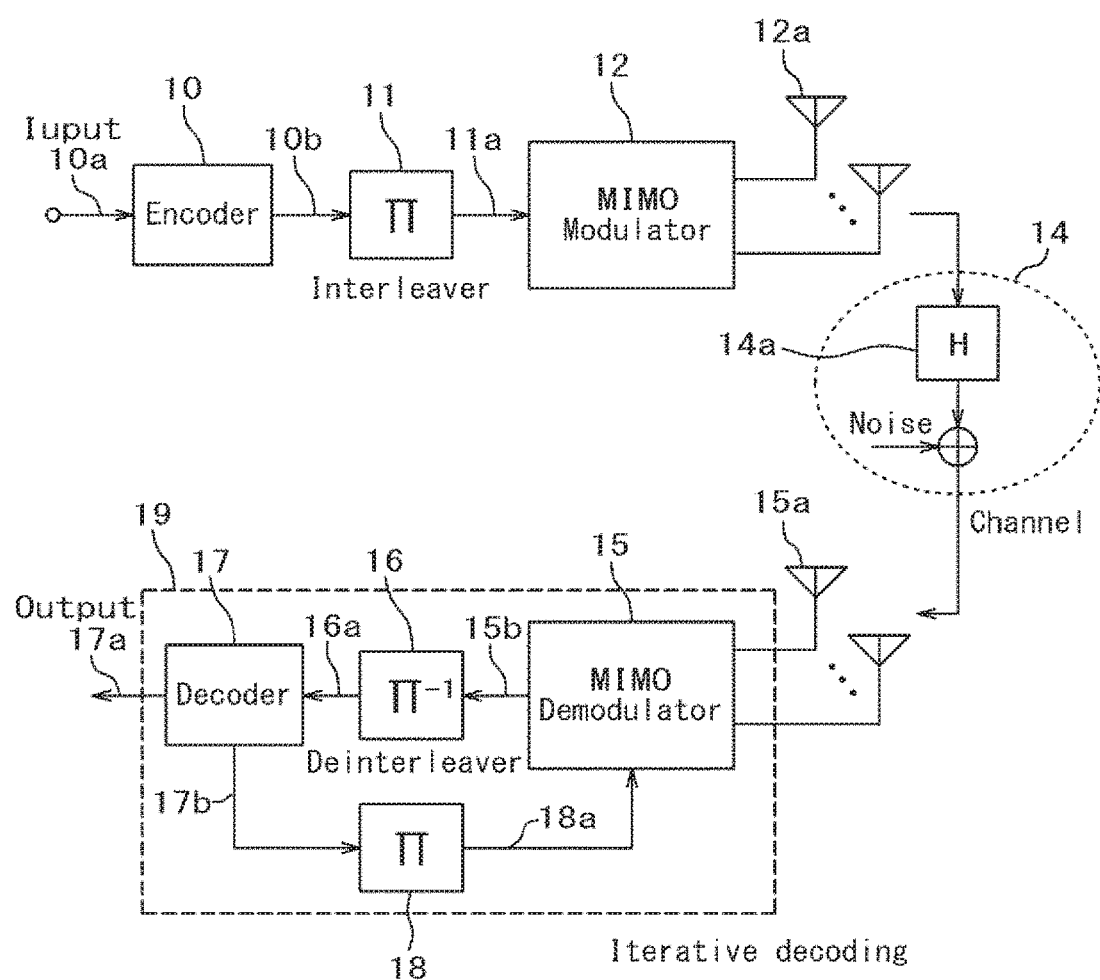
FIG. 1 is a diagram illustrating a configuration of a wireless communication system according to a first embodiment of the present invention.

FIG. 1 illustrates a configuration of a wireless communication system according to the first embodiment, specifically, a basic configuration of a transmitter and a receiver using BICM-ID. This configuration is same as a basic configuration of a conventional BICM-ID except that a MIMO modulator 12 is used as a modulator on a transmission side and a MIMO demodulator 15 is used as a demodulator on a receiving side.

The transmitter includes an encoder 10, an interleaver 11 which randomly exchange an information bit order, the MIMO modulator 12, and multiple antennas 12a. The receiver includes multiple antennas 15a, the MIMO demodulator 15, a deinterleaver 16 which restores the information bit order to an original order, a decoder 17, and an interleaver 18.

A signal wirelessly sent from the multiple antennas 12a of the transmitter (the MIMO modulator 12) is received by the multiple antennas 15a of the receiver (the MIMO demodulator 15) via a wireless channel, in other words, a wireless propagation path 14. Channel information 14a indicating a state of the wireless propagation path 14 and noise are reflected to the signal received by the receiver.

In the transmitter, the encoder 10 encodes a set of input information bits 10a (for example, a bit number g) and outputs as coded bits 10b (for example, a bit number h) to the interleaver 11. The interleaver 11 performs interleave processing to randomly exchange a bit order of every encoded codeword bits (the coded bits 10b), generates coded bits 11a, and outputs the coded bits 11a to the MIMO modulator 12. The MIMO modulator 12 performs modulation processing according to the wireless propagation path 14 and outputs a modulation signal (transmission symbol) from the antennas 12a.

In the receiver, the MIMO demodulator 15 performs demodulation processing on a received signal (received symbol) input from the antennas 15a and outputs coded bits 15b (first extrinsic extrinsicinformation) to the deinterleaver 16. The deinterleaver 16 once stores a bit likelihood signal corresponding to every codeword bits (the coded bits 11a) encoded and interleaved on a transmission side, performs deinterleave processing to return an order of bit lines exchanged by the interleaver 11 on the transmission side, and outputs the coded bits 16a (second extrinsic extrinsic information) to the decoder 17. The decoder 17 decodes the coded bits 16a and outputs coded bits 17b (third extrinsic extrinsicinformation). The interleaver 18 performs interleave processing to the coded bits 17b, and supplies coded bits 18a (fourth extrinsic extrinsicinformation) to the MIMO demodulator 15. The MIMO demodulator 15 performs demodulation processing again by using the coded bits 18a (fourth extrinsic extrinsic information) based on information from the decoder 17 as a priori information and outputs a further accurate demodulation result.

In this manner, an iterative decoding processing unit 19 includes the MIMO demodulator 15, the deinterleaver 16, the decoder 17, and the interleaver 18. In BICM-ID, the iterative decoding processing unit 19 iteratively performs the iterative decoding processing, and after maximizing the a posteriori probability of an obtained signal, a final decoder output 17a (corresponding to the input information bits 10a on a transmission side) is obtained.

For example, as the encoder 10 illustrated in FIG. 1, a repetition encoder, which generates a repetition code being a simple code decoded with a small calculation amount, can be used. A degree dv of the repetition encoder is arbitrary. For example, a set of information bits (the information bits 10a) including two bits (a1 and a2) is encoded to second-order (dv=2) codeword bits (a1, a1, a2, and a2), and the coded bits 10b can be generated. The interleaver 11 generates the coded bits 11a by randomly exchanging a bit order of the every codeword bits (a1, a1, a2, and a2).

Further, as a modulator corresponding to the MIMO modulator 12 in FIG. 1, general modulation such as quadrature amplitude modulation (QAM), amplitude shift keying (ASK), phase shift keying (PSK), and frequency shift keying (FSK) can be used according to a signal to a noise ratio (SNR).

For example, the encoder 10 encodes two bit input signal (the information bits 10a) and outputs four bit signal (the coded bits 10b). The interleaver 11 performs interleave processing to the four bit signal and outputs four bit signal (the coded bits 11a) to the MIMO modulator 12. The MIMO modulator 12 performs modulation per two bits on the input four bit signal by using, for example, QPSK and simultaneously outputs each of two bit transmission signals T1 (bits b0 and b1) and T2 (bits b2 and b3) from two antennas 12a.

The transmission signals T1 and T2 are received as received signals R1 and R2, in which T1 and T2 are mixed, by the two antennas of the receiver via the wireless propagation path (channel) 14. Specifically, the received signals R1 and R2 are represented by the following [Formula 1]. Here, h11, h12, h21, and h22 are the channel information 14a. The channel information can be obtained based on a received signal and a known signal by transmitting the known signal.

$$\begin{bmatrix} R_1 \\ R_2 \end{bmatrix} = \begin{bmatrix} h_{11} & h_{12} \\ h_{21} & h_{22} \end{bmatrix} \begin{bmatrix} T_1 \\ T_2 \end{bmatrix}$$ [Formula 1]

Figure 2:
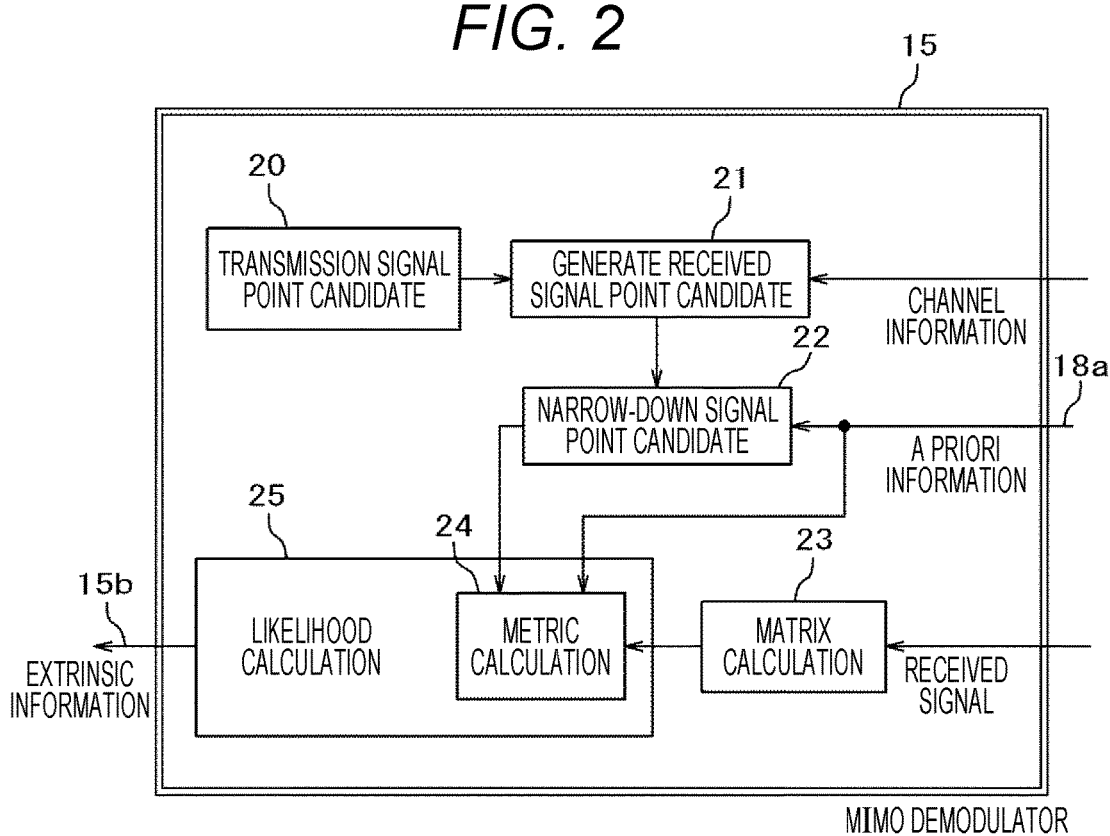
FIG. 2 is a diagram illustrating a configuration of a MIMO demodulator according to the first embodiment.

FIG. 2 is a diagram illustrating a configuration of the MIMO demodulator according to the first embodiment.

As illustrated in FIG. 2, the MIMO demodulator 15 includes a transmission signal point candidate generator 20, a received signal point candidate generator 21, a received signal point candidate narrowing-down unit 22, a matrix calculation unit 23, and a likelihood calculation unit 25. The likelihood calculation unit 25 includes a metric calculation unit 24.

Figure 3A:
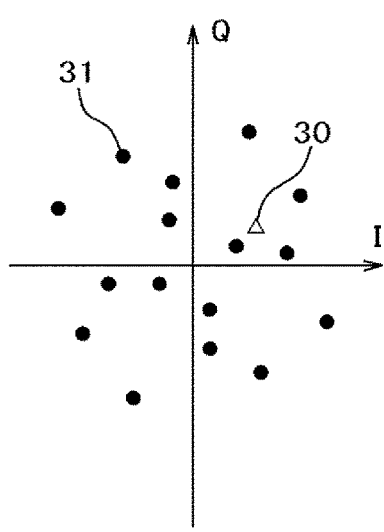
FIGS. 3A and 3B are diagrams illustrating an example of a method for narrowing, by a metric magnitude, received signal point candidates down to those to be used in a likelihood calculation according to the first embodiment.

The transmission signal point candidate generator 20 generates every transmission signal point candidates (in other words, transmission symbols) which can be generated in the MIMO modulator 12 on a transmission side. The transmission signal point candidates are indicated, for example, as black circles 31 illustrated in FIG. 3(a) on an IQ plane. The black circles 31 illustrated in FIG. 3(a) are received signal point candidates to be described later.

The received signal point candidate generator 21 generates received signal point candidates based on the transmission signal point candidates generated by the transmission signal point candidate generator 20 and channel information which is propagation path information of the wireless propagation path 14. The channel information is preliminarily obtained as described above and stored in a receiver. The received signal point candidates are the transmission signal point candidates that have been corrected based on the channel information, and a same number of the received signal point candidates as a number of the transmission signal point candidates are generated. The received signal point candidates are indicated on an IQ plane, for example, like black circles 31 in FIG. 3(a). The generated received signal point candidates are used for a metric calculation to be described later.

The received signal point candidate narrowing-down unit 22 narrows a plurality of the received signal point candidates generated by the received signal point candidate generator 21 down to received signal point candidates to be used in calculation (specifically, calculation in the metric calculation unit 24 to be described later) in the likelihood calculation unit 25. At this time, the received signal point candidate narrowing-down unit 22 narrows a plurality of the generated received signal point candidates down to the received signal point candidates to be used in calculation in the likelihood calculation unit 25 based on a magnitude of a priori information 18a (the fourth extrinsic extrinsicinformation=a priori information) from the decoder 17 and a distance between a plurality of the received signal point candidates generated by the received signal point candidate generator 21 and a signal received by the demodulator 15.

For example, the received signal point candidate narrowing-down unit 22 determines a number of the received signal point candidates to be used in the likelihood calculation unit 25 based on a magnitude of a priori information 18a (the fourth extrinsic extrinsicinformation=a priori information) and determines the received signal point candidates to be used in the likelihood calculation unit 25 based on a distance between a plurality of the received signal point candidates generated by the received signal point candidate generator 21 and the signal received by the MIMO demodulator 15.

In the case where the received signal point candidate narrowing-down unit 22 is formed in this manner, a number of the received signal point candidates to be used in a calculation in the likelihood calculation unit 25 is determined. Therefore, a calculation amount of the likelihood calculation unit 25 and, thus, a calculation amount of the iterative decoding processing unit is easily reduced to a predetermined amount or less.

For example, as a size of the information bits 18a (the fourth extrinsic information=a priori information) is increased, a number of the received signal point candidates to be used in calculation in the likelihood calculation unit 25 is reduced. Also, received signal point candidates in which a distance between a plurality of the received signal point candidates and the received signal are closer (the distance is smaller) are used in the calculation in the likelihood calculation unit 25.

For example, as the distance between a plurality of the received signal point candidates and the received signal, a metric calculation value by the metric calculation unit 24 can be used. According to the above-described configuration, received signal point candidates can be narrowed down to more suitable ones as the received signal point candidates used in a likelihood calculation. This is because, as described later, the metric calculation value includes an a priori probability of received signal point candidates.a priori information Alternatively, the received signal point candidate narrowing-down unit 22 can narrow a plurality of the received signal point candidates generated by the received signal point candidate generator 21 down to received signal point candidates, in which a distance between the received signal received by the MIMO demodulator 15 is equal to or less than a predetermined value r1, as received signal point candidates to be used in calculation by the likelihood calculation unit 25, and the value r1 can be decreased as the a priori information is increased.

With the received signal point candidate narrowing-down unit 22 formed in this manner, a number of the received signal point candidates to be used in calculation in the likelihood calculation unit 25 is decreased when the a priori information is larger in comparison with a case in which the a priori information is small. Further, the received signal point candidate can be easily narrowed down to those to be used in the likelihood calculation.

Alternatively, from a plurality of the received signal point candidates generated by the received signal point candidate generator 21, the received signal point candidate narrowing-down unit 22 can narrow received signal point candidates down to those in which a metric calculation value by the metric calculation unit 24 is equal to or less than an arbitrary value r2, as the received signal point candidates to be used in calculation in the likelihood calculation unit 25, and the value r2 can be decreased as the a priori information is increased.

With the received signal point candidate narrowing-down unit 22 formed in this manner, a number of the received signal point candidates to be used in calculation in the likelihood calculation unit 25 is decreased when the a priori information is larger in comparison with a case in which the a priori information is small. Further, the received signal point candidates can be easily narrowed down to those to be used in a likelihood calculation, and also more suitable received signal point candidates can be selected as the received signal point candidate to be used in the likelihood calculation.

As described above, the received signal point candidate narrowing-down unit 22 narrows a plurality of the received signal point candidates generated by the received signal point candidate generator 21 down to received signal point candidates to be used to create the first extrinsic information 15b. Then, as the fourth extrinsic information 18a (a priori information) is increased by performing iterative decoding processing by the iterative decoding processing unit 19, a number of the received signal point candidates to be used to create the first extrinsic information 15b. As a result, as a magnitude of the information bits 18a (the fourth extrinsic information=a priori information) is increased, a calculation processing amount in the likelihood calculation unit 25 and, thus, a calculation processing amount of the MIMO demodulator 15 can be reduced.

The likelihood calculation unit 25 calculates and creates the first extrinsic information 15b based on the received signal point candidates narrowed down by the received signal point candidate narrowing-down unit 22, the fourth extrinsic information 18a as a priori information, and a received signal. As described above, the likelihood calculation unit 25 includes the metric calculation unit 24.

The metric calculation unit 24 performs a metric calculation by [Formula 4] to be described later, based on the received signal and the a priori information 18a (the fourth extrinsic information). The metric calculation is a part of a likelihood calculation performed by the likelihood calculation unit 25, and a metric calculation result is referred to by the received signal point candidate narrowing-down unit 22 depending on a calculation amount reduction method.

The likelihood calculation unit 25 calculates a bit likelihood by [Formula 3] to be described later by using the metric calculation result and outputs the bit likelihood as the first extrinsic information 15b.

The matrix calculation unit 23 is used to reduce a processing amount of the likelihood calculation unit 25. In the case where a tree structure to be described later is not used, the matrix calculation unit 23 may not be used. The case where a matrix calculation is not performed is equivalent to the case where a unit matrix is multiplied to a received signal.

By using the a priori information 18a from the decoder 17 and a received signal, the MIMO demodulator 15 according to the embodiment calculates a posteriori information and outputs extrinsic information 15b obtained by subtracting the a priori information from the calculated a posteriori information.

The extrinsic information 15b is generally output by a form of a log likelihood ratio (LLR) per bit. The LLR is a logarithmic representation of a ratio between a probability that the bit is zero and a probability that the bit is one, and is represented by [Formula 2]. In [Formula 2], P (b=0) is a probability that the bit b is zero, and P (b=1) is a probability that the bit b is one.

$$L(b) = \log \frac{P(b=0)}{P(b=1)} \qquad \text{[Formula 2]}$$

It is known that extrinsic information Le (the first extrinsic information 15b) in the MIMO demodulator 15 is calculated by [Formula 3] using a priori information La (the fourth extrinsic information 18a) and a received signal y. In [Formula 3], "$c_k$" indicates received signal point candidates obtained from channel information and transmission signal point candidates, "$c_k$ (bj)" indicates a j-th bit (0 or 1) of the received signal point candidates $c_k$, and "$\sigma$" indicates a standard deviation of noise at a receiving side. "i" is an index indicating a bit to be calculated, "j" is an index indicating a related bit other than the bit i to be calculated. The first term of [Formula 3] is a logarithmic ratio of a total sum of the probability of a symbol that the bit is zero and a total sum of the probability of a symbol that the bit is one.

$$L_e(b_i) = \log \frac{\sum_{c_k|c_k(b_i)=0} \exp\left(-\frac{|y-c_k|^2}{\sigma^2} - \sum_j c_k(b_j)L_a(b_j)\right)}{\sum_{c_k|c_k(b_i)=1} \exp\left(-\frac{|y-c_k|^2}{\sigma^2} - \sum_j c_k(b_j)L_a(b_j)\right)} - L_a(b_i) \qquad \text{[Formula 3]}$$

For example, in the case where one symbol is two bits (in other words, four value modulation/demodulation), when the extrinsic information Le (b0) of the bit b0 is calculated, a numerator of the first term of [Formula 3] means a total sum related to the received signal point candidates $c_k$ (b0b1=00, 01) in which the bit b0=0. Further, a denominator of the first term of [Formula 3] means a total sum related to the received signal point candidate $c_k$ (b0b1=10, 11) in which the bit b0=1.

Further, it is known that a metric calculation is a part of a calculation by [Formula 3], and a metric R which is a result of the metric calculation is calculated by [Formula 4].

$$R = \frac{|y-c_k|^2}{\sigma^2} + \sum_j c_k(b_j)L_a(b_j) \qquad \text{[Formula 4]}$$

The first term of [Formula 4] is a value obtained by weighting a distance between a received signal and a received signal point candidate by dispersion of noise, and the second term is a value corresponding to an a priori probability of the received signal point candidate. As a likelihood calculation in the likelihood calculation unit 25, it is preferable that a rigid formula represented by [Formula 3] is used. However, to reduce a calculation amount, the total sum calculation processing in [Formula 3] can be replaced with maximum value detection processing. As a method to replace the total sum calculation processing with the maximum value detection processing, a method called Max Log Map is known.

In addition, a second-order norm ($|y-c_k|^2$) is used in the first term in a metric calculation by [Formula 4]. However, the norm may be substituted for an approximate norm such as a zero-order norm ($\max(|y|, |c_k|)$) and a first-order norm ($|y|+|c_k|$). When the above-described approximate norm is used, a constant is multiplied to a final likelihood, and deterioration of decoding characteristics can be suppressed by adjusting a magnitude of the likelihood.

An order of the output extrinsic information 15b (first extrinsic information) of the MIMO demodulator 15 is changed in the deinterleaver 16 and the output extrinsic information 15b is input to the decoder 17. The a priori information 18a (fourth extrinsic information) input to the MIMO demodulator 15 is information in which an order of the third extrinsic information 17b output from the decoder 17 is changed by the interleaver 18. Calculation of the extrinsic information 17b of the decoder 17 depends on an encoding method. For example, in NPL 5, a repetition code is used as a decoder. It is known that the extrinsic information 17b of the repetition code is a value obtained by subtracting a priori information from a total sum of LLR of a codeword and represented by [Formula 5].

$$L_e(b_i) = \sum_j L_a(b_j) - L_a(b_i)$$ [Formula 5]

In [Formula 5], "i" is an index to be calculated, "j" is an index of a related bit to be calculated.

The MIMO demodulator 15 of the present embodiment narrows down to the received signal point candidates $c_k$ generated by the received signal point candidate generator 21 based on the a priori information La (the fourth extrinsic information 18a) to reduce a calculation amount. An optimum processing in a likelihood calculation in the likelihood calculation unit 25 is the MAP processing, and the extrinsic information Le (the first extrinsic information 15b) is preferably calculated by using [Formula 3] based on every received signal point candidates $c_k$ and the a priori information La. However, in the present embodiment, instead of using the every received signal point candidates $c_k$, the received signal point candidates $c_k$ which significantly affects the extrinsic information Le (the first extrinsic information 15b) is used in [Formula 3]. As a result, a calculation amount can be reduced while suppressing deterioration of decoding characteristics.

Further, in the MIMO demodulator 15 according to the embodiment, a number of the received signal point candidates $c_k$ is reduced as the a priori information La is increased, and a calculation amount is reduced. Generally, by reducing a number of the received signal point candidates $c_k$, characteristic deterioration of the MAP processing is increased. However, as the a priori information La is increased, a metric R indicated by [Formula 4] is decreased with respect to a part of the received signal point candidates $c_k$, and a metric R is increased with respect to other received signal point candidate $c_k$ is increased. As a result, a part of the received signal point candidates $c_k$, in which the metric R is small, largely affects the extrinsic information Le, and contribution to the extrinsic information Le of the received signal point candidates $c_k$ in which the metric R is large is reduced. Accordingly, in comparison with the case where a priori information La is not used and the case where the a priori information La is small, in the case where a priori information La is large, characteristic deterioration caused by reducing a number of received signal point candidates can be reduced by using the received signal point candidate $c_k$ with a small metric R.

Figure 3B:
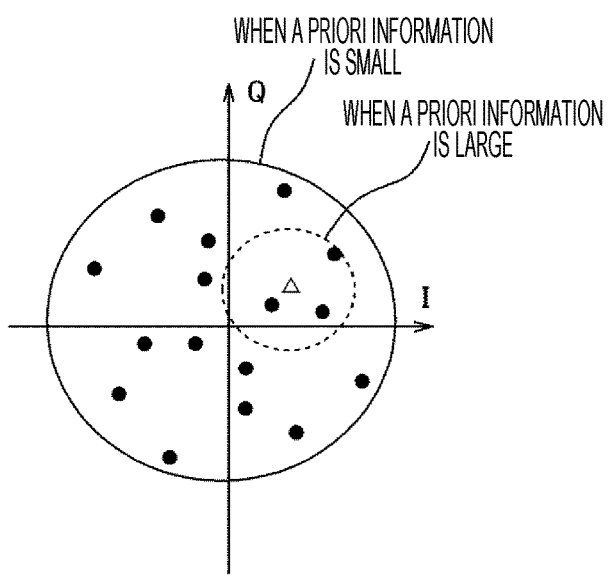

FIGS. 3(a) and 3(b) are diagrams illustrating an example of a method for narrowing received signal point candidates down to those to be used in a likelihood calculation in the first embodiment. In FIG. 3(a), a received signal point 30 and received signal point candidates 31 are indicated on an IQ plane in the case where a number of received signal point candidates is sixteen. In an example in FIG. 3, received signal point candidates are narrowed down based on a distance between the received signal point 30 and the received signal point candidates 31. The received signal point candidates 31 in which the distance is equal to or less than a certain distance is used in a likelihood calculation by the likelihood calculation unit 25.

In the case where the a priori information La is small as illustrated in FIG. 3(b), a reference distance r1 from the received signal point 30 to be used for narrowing down is set to a substantially large distance, and the likelihood calculation in [Formula 3] is performed by using every one of sixteen received signal point candidates. In the case where the a priori information La is large, the reference distance r1 from the received signal point 30 is changed to a small distance, and received signal point candidates to be used in the likelihood calculation in [Formula 3] are narrowed down to those near the received signal point 30. In the example in FIG. 3, as illustrated in FIG. 3(b), three received signal point candidates are used in the likelihood calculation in the case where the a priori information La is large, and in comparison with the case where the a priori information La is small, the received signal points used in the likelihood calculation are reduced to ⅕ or less.

To clarify a description in the example in FIG. 3, an example is indicated in which received signal point candidates are narrowed down based on the distance r1 from a received signal point. However, it is preferable that an arbitrary variable r2 is determined by using the metric R in [Formula 4], and received signal point candidates are narrowed down such that the received signal point candidates in which the metric R is equal to or less than the value r2 are used in the likelihood calculation. In the case where the a priori information La is zero according to [Formula 4], the metric R corresponds to the distance r1 between the received signal point 30 and the received signal point candidate 31. In the first time of iterative decoding processing in BICM-ID, the a priori information La input to the MIMO demodulator 15 is zero. Therefore, the value r2 which leads to allowable characteristic deterioration is determined with respect to the metric R in the first time, the value r2 is changed to a smaller value than the first time value of the iterative decoding processing as the a priori information is increased by the iterative decoding processing in the BICM-ID, and a calculation amount on later stages of the iterative decoding processing in the BICM-ID is reduced. In the case where the calculation amount needs to be strictly defined, a method may be used in which how many received signal point candidates are to remain after narrowing down is previously determined, and the received signal point candidates are selected in descending order of influence on calculation of the extrinsic information Le.

Figure 4A:
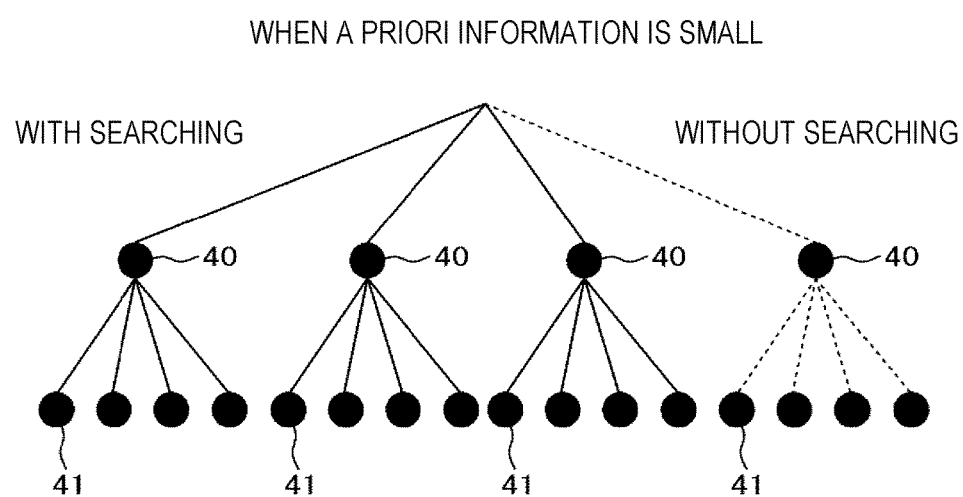
FIGS. 4A and 4B are diagrams illustrating an example of a method for narrowing, by using a hierarchical tree structure, the received signal point candidates down to those to be used in the likelihood calculation according to the first embodiment.
Figure 4B:
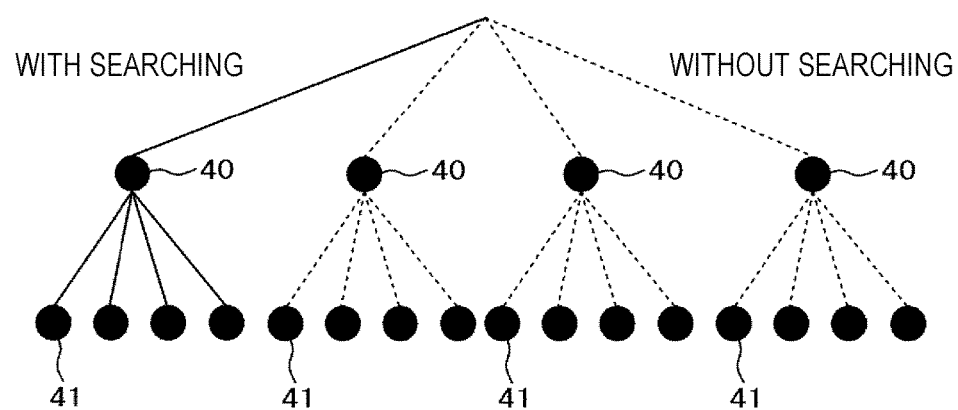

In such a method, received signals are converted to a hierarchical tree structure, and it is effective to narrow down received signal point candidates on upper layers of the tree. FIGS. 4(a) and 4(b) are diagrams illustrating an example of a method for narrowing received signal point candidates down to those to be used in a likelihood calculation in the first embodiment by using a hierarchical tree structure. FIG. 4 indicates a tree structure of received signals in the case where four value (two bits) signals (T1 and T2) are sent from each of two transmission antennas. In this case, a total number of received signal point candidates of the signals (R1 and R2) received by the MIMO demodulator 15 are sixteen.

In the MIMO demodulator 15, received signal point candidates can be converted into a tree structure by a matrix calculation using QR decomposition. In the tree structure, received signal point candidates 40 sent from one antenna are set on the highest layer, and subsequent received signal point candidates are set to received signal point candidates 41 in the case where signals sent from multiple antennas are mixed. For example, the received signals R2 can be set to the received signal point candidate 40 indicated by the signal T2, and the received signals R1 can be set to the received signal point candidates 41 in which the signals T1 and T2 are mixed.

In the case where the a priori information La illustrated in FIG. 4(*a*) is small, the MIMO demodulator 15 keeps three, in ascending order of the metric R, out of four points on the highest layer 40 in the tree structure, and total fifteen points including twelve points of the received signal point candidates 41 on lower layers are searched and used in a likelihood calculation. On the other hand, in the case where the a priori information La illustrated in FIG. 4(*b*) is large, the MIMO demodulator 15 keeps one point having the smallest metric R out of four points on the highest layer 40 in the tree structure, and total five points including four points of the received signal points 41 on lower layers are searched and used in a likelihood calculation. In this manner, a calculation amount of MIMO demodulation processing can be reduced by reducing a number of received signal point candidates to be used in a likelihood calculation in the case where the a priori information is larger in comparison with the case where the a priori information is small.

As described above, in the embodiment, received signal point candidates to be used in a likelihood calculation is determined based on a magnitude of the a priori information La. As an index for estimating a magnitude of an a priori information, the a priori information itself can be used as described above. However, to estimate a magnitude of the a priori information as accurately as possible, the mutual information Im of a bit represented by [Formula 6] is preferably used. [Formula 6] is publicly known. The mutual information Im is a mutual information between a transmission side and a receiving side.

$$I_m = \Sigma(1 + p(b=0)\log p(b=0) + p(b=1)\log p(b=1))$$ [Formula 6]

As described above, in the case where the mutual information Im is used as an index to estimate a magnitude of a a priori information, although a calculation amount to calculate the mutual information Im is increased, a magnitude of the a priori information can be accurately estimated. Therefore, deterioration of BICM-ID decoding characteristics can be reduced.

In the case where the a priori information itself is used as described above, although deterioration of the BICM-ID decoding characteristics might be increased in comparison with the case of using the mutual information Im, it can correspond to a dynamic change of radio wave propagation environment and also easily corresponds to a change in an installation site of a transmitter and a receiver. In addition, a calculation amount of a demodulator can be reduced in comparison with the case of determining based on a mutual information of a priori information.

The mutual information Im in [Formula 6] is an average in every codewords (for example, for one thousand symbols) of a mutual information per bit and indicated by zero to one value, and it is indicated that as the mutual information approaches one, the a priori information La is large. In BICM-ID processing, changes in the information amount of every codewords to be used in iterative decoding processing determines BICM-ID decoding characteristics. Therefore, a statistic in the every codewords of the a priori information La input to the MIMO demodulator 15 is preferably used for an index indicating a magnitude of the a priori information La. As an index indicating a magnitude of the a priori information La, in the case where an index other than the mutual information Im in [Formula 6] is used, for example, a statistic such as an average value of an absolute value of the a priori information La, a variance, a standard deviation, a maximum value, a mode value, and a median value is preferably used.

Figure 5:
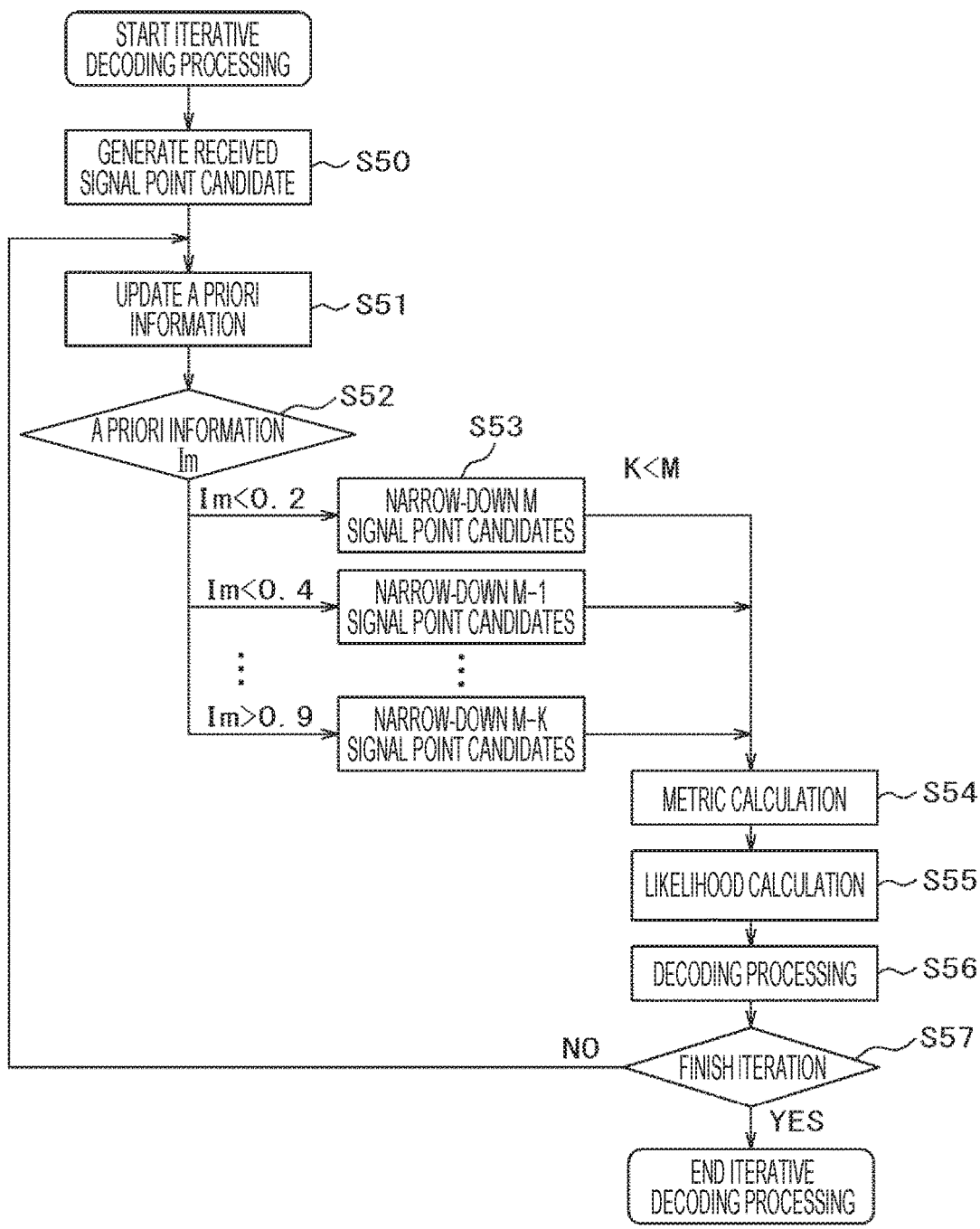
FIG. 5 is a flowchart illustrating an example of BICM-ID processing according to the first embodiment.

FIG. 5 is a flowchart illustrating an example of BICM-ID processing according to the first embodiment. In this BICM-ID processing, first, based on transmission signal point candidates and channel information, received signal point candidates are generated (Step S50 in FIG. 5). The a priori information La to be used in the MIMO demodulator 15 is updated per iterative decoding processing (Step S51). A magnitude of the mutual information Im of the a priori information La is determined (Step S52), and a number of received signal point candidates to be narrowed down to is determined according to a magnitude of the mutual information Im (Step S53).

The number of the received signal point candidates to be narrowed down to is determined such that received signal point candidates to be used in a likelihood calculation are reduced as the mutual information Im of the a priori information La is increased. In the example illustrated in FIG. 5, in the case where the mutual information Im is smaller than 0.2, every M received signal point candidates are used in a likelihood calculation by the likelihood calculation unit 25. Further, in the case where the mutual information Im is 0.2 or more and 0.4 or less, (M−1) received signal point candidates are used in the likelihood calculation by the likelihood calculation unit 25. Further, in the case where the mutual information Im is 0.9 or more, (M−K) received signal point candidates are used in the likelihood calculation by the likelihood calculation unit 25. However, K is smaller than M (K<M). The numbers of received signal point candidates K and M are clearly determined by a method using QR decomposition and M algorism. In addition, by changing a metric to be used for narrowing-down in the case of using SD, a number of received signal point candidates is indirectly changed.

Further, to specify received signal point candidates to be used in a likelihood calculation, a method using a magnitude of the metric R, specifically a method in which a determined number of received signal point candidates is selected in ascending order of the metric R. Specifically, a metric calculation (Step S54) is performed to every received signal point candidates generated in Step S51, the metric R of each received signal point candidate is calculated, and received signal point candidates to be used in a likelihood calculation is selected in ascending order of the metric R. A probability in the case of a bit=0 and a probability in the case of a bit=1 are needed in the likelihood calculation. Therefore, as a result of narrowing down received signal point candidates, it is preferable that at least one signal point candidate in which the corresponding bit is 0 or 1 remains so as to avoid the case where there are no received signal point candidates in which the corresponding bit is 0 or 1.

Strictly speaking, a metric magnitude is preferably used for narrowing down. However, a part corresponding to the norm of a received signal point and a received signal point candidate in a metric in [Formula 4], more specifically, a part corresponding to a distance between a received signal point and a received signal point candidate, may be used for narrowing down.

Next, by using the narrowed-down received signal point candidates in Step S54, a likelihood calculation (Step S55) is performed, and extrinsic information of the MIMO demodulator 15 is calculated and output to the decoder 17 via the deinterleaver 16. The decoder 17 decodes a process result of the MIMO demodulator 15 (Step S56). In the case where it is determined that iterative decoding processing is not finished (No in Step S57), the extrinsic information 17b of a decoding result is output, and Step S51 is performed again. Completion of the iterative decoding processing is determined by a number of iterations of the iterative decoding processing. The extrinsic information 17b is input as the a priori information La of the MIMO demodulator 15 via the interleaver 18 In the case where it is determined that the iterative decoding processing is finished (Yes in Step S57), the iterative decoding processing is finished.

According to the first embodiment, at least the following effect can be obtained.

(A1) A demodulator of an iterative decoding processing unit generates multiple received signal point candidates, and the generated multiple received signal point candidates are narrowed down to received signal point candidates to be used in a likelihood calculation (creation of first extrinsic information), based on a magnitude of a priori information and a distance between the generated received signal point candidates and a received signal. Therefore, a calculation amount of the iterative decoding processing unit can be reduced.

(A2) The demodulator of the iterative decoding processing unit can determine a number of the received signal point candidates to be used in the likelihood calculation based on a magnitude of the a priori information and can determine the received signal point candidates to be used in the likelihood calculation based on a distance between the generated received signal point candidates and the received signal. In the above-described configuration, a number of the received signal point candidates to be used in the likelihood calculation is determined, and therefore a calculation amount of the iterative decoding processing unit can be easily reduced to a predetermined amount or less.

(A3) The demodulator of the iterative decoding processing unit includes a metric calculation unit for calculating a metric calculation value, and the metric calculation value is used as a distance between the generated multiple received signal point candidates and the received signal. In the above-described configuration, the metric calculation value includes a probability of received signal point candidates according to a priori information, and therefore more suitable candidates can be selected as the received signal point candidates to be used in the likelihood calculation.

(A4) Received signal point candidates are narrowed down to those in which a distance from the signal received by the demodulator is an arbitrary value r1 or less as the received signal point candidates to be used in the likelihood calculation, and the value r1 can be reduced as the a priori information is increased. In the above-described configuration, the received signal point candidates can be easily narrowed down to those to be used in the likelihood calculation.

(A5) The likelihood calculation includes a metric calculation, and received signal point candidates are narrowed down to those in which a metric calculation value is equal to or less than the arbitrary value r2 as the received signal point candidates to be used in the likelihood calculation. By reducing the value r2 as the a priori information is increased, a number of the received signal point candidates to be used in the likelihood calculation can be reduced. In the above-described configuration, the received signal point candidates can be easily narrowed down to those to be used in the likelihood calculation, and more suitable received signal point candidates can be selected as the received signal point candidate to be used in the likelihood calculation.

(A6) A magnitude of the a priori information can be determined based on a mutual information of the a priori information. In the above-described configuration, although a calculation amount to calculate the mutual information is increased, the magnitude of the a priori information can be accurately estimated. Therefore, deterioration of BICM-ID decoding characteristics can be reduced.

(A7) The magnitude of the a priori information can be determined based on an average value of an absolute value, a variance, a standard deviation, a maximum value, a mode value, or a median value which is a statistic of the a priori information. In the above-described configuration, in comparison with the case of determining based on a mutual information of the a priori information, deterioration of BICM-ID decoding characteristics is increased. However, the configuration can correspond to a dynamic change of the radio wave propagation environment and adapt to a change in an installation site of a transmitter and a receiver. In addition, a calculation amount of the demodulator can be reduced in comparison with the case of determining based on a mutual information of the a priori information.

Second Embodiment

A second embodiment of the present invention will be described next.

In the above-described first embodiment, the example has been described in which a number of received signal point candidates to be used in a likelihood calculation is changed by using a mutual information and a statistic of a priori information. However, in BICM-ID, a demodulator and a decoder are designed such that a mutual information of the a priori information transmitted between the demodulator and the decoder is gradually increased as a number of iterations in iterative decoding processing is increased. Therefore, in the BICM-ID, a magnitude of the a priori information can be estimated by using the iterative number of times.

In the second embodiment, a number of times of the iterative decoding processing in the BICM-ID is used instead of the a priori information, and a number of received signal point candidates to be used in a likelihood calculation is changed based on this number of times. The second embodiment is same as the first embodiment except that a number of iterations of the BICM-ID is used Instead of the a priori information.

Figure 6:
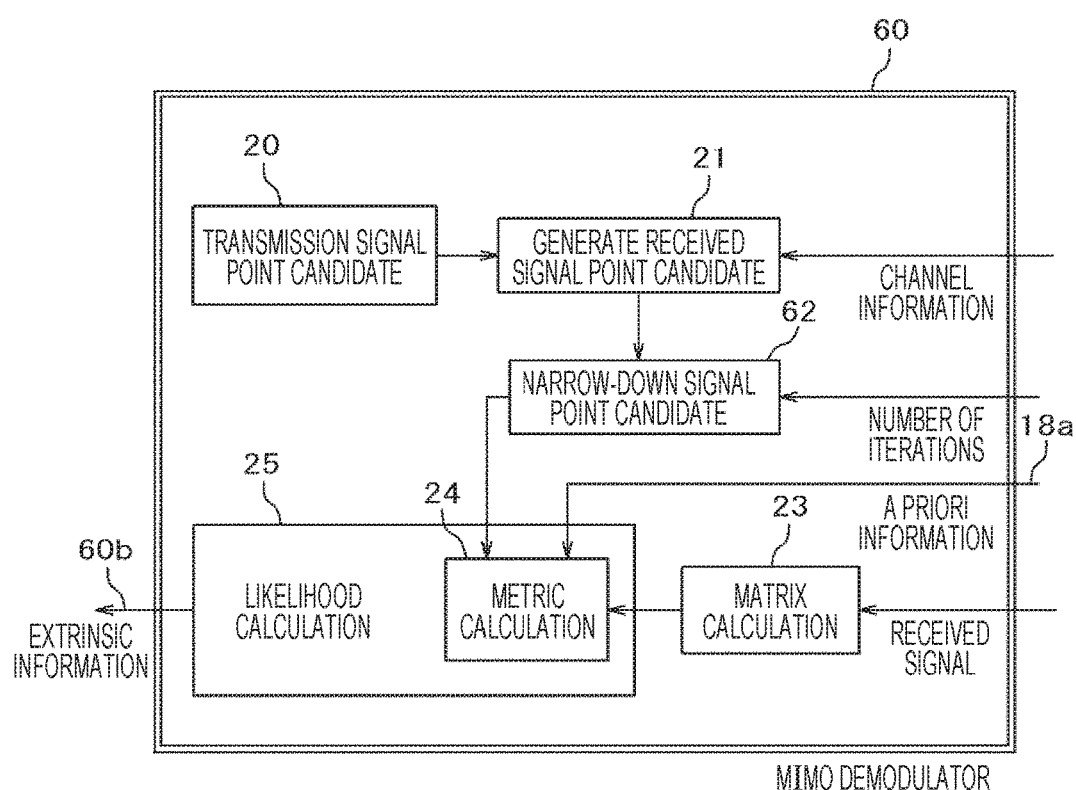
FIG. 6 is a diagram illustrating a configuration of a MIMO demodulator according to a second embodiment.

FIG. 6 is a diagram illustrating a configuration of a MIMO demodulator according to the second embodiment. In a wireless communication system according to the second embodiment, the MIMO demodulator 15 illustrated in FIG. 1 (a configuration of the wireless communication system according to the first embodiment) is replaced to a MIMO demodulator 60 illustrated in FIG. 6. Further, in the MIMO demodulator 60, the received signal point candidate narrowing-down unit 22 illustrated in FIG. 2 (a configuration of the MIMO demodulator according to the first embodiment) is replaced to a received signal point candidate narrowing-down unit 62 illustrated in FIG. 6. In a configuration of the MIMO demodulator 60 illustrated in FIG. 6, the same portion as in the configuration illustrated in FIG. 2 is denoted by the same reference signs, and descriptions thereof will not be repeated.

In the MIMO demodulator 60 according to the second embodiment, the received signal point candidate narrowing-down unit 62 narrows a plurality of the received signal point candidates generated in a received signal point candidate generator 21 down to received signal point candidates to be used in a likelihood calculation by a likelihood calculation unit 25. At this time, the received signal point candidate narrowing-down unit 22 narrows a plurality of the generated received signal point candidates down to received signal point candidates to be used in a likelihood calculation based on a number of iterations of the BICM-ID and a distance between a plurality of the received signal point candidates generated by the received signal point candidate generator 21 and the signal received by a demodulator 15.

For example, the received signal point candidate narrowing-down unit 62 determines a number of received signal point candidates to be used in calculation in the likelihood calculation unit 25 based on a number of iterations in the BICM-ID and determines received signal point candidates to be used in the calculation in the likelihood calculation unit 25 based on a distance between a plurality of the received signal point candidates generated by the received signal point candidate generator 21 and the signal received by the MIMO demodulator 60.

For example, as a number of iterations in the BICM-ID is increased, a number of the received signal point candidates to be used in a calculation in the likelihood calculation unit 25 is reduced, and also received signal point candidates in which a distance between a plurality of the received signal point candidates and the received signal are close (the distance is small) are used in the calculation by the likelihood calculation unit 25.

In the case where the received signal point candidate narrowing-down unit 62 is formed in this manner, since a number of the received signal point candidates to be used in a calculation in the likelihood calculation unit 25 is determined, a calculation amount of the iterative decoding processing unit can be easily reduced to a predetermined amount or less.

For example, as a distance between a plurality of the received signal point candidates and the received signal, a metric calculation value in a metric calculation unit 24 can be used. According to the above-described configuration, received signal point candidates can be narrowed down to more suitable ones as the received signal point candidates used in a likelihood calculation. This is because the metric calculation value includes an a priori probability of received signal point candidates.

Alternatively, the received signal point candidate narrowing-down unit 62 narrows a plurality of the received signal point candidates generated by the received signal point candidate generator 21 down to received signal point candidates, in which a distance between the received signal received by the MIMO demodulator 60 is equal to or less than a predetermined value r1, as the received signal point candidates to be used in a calculation in the likelihood calculation unit 25, and the value r1 can be reduced as the number of iterations in the BICM-ID is increased.

When the received signal point candidate narrowing-down unit 62 is formed as described above, a number of the received signal point candidates to be used in a calculation in the likelihood calculation unit 25 is reduced in the case where the number of iterations of the BICM-ID is larger in comparison with the number of iterations of the BICM-ID is small. Further, the received signal point candidates can be easily narrowed down to those to be used in the likelihood calculation.

Alternatively, the received signal point candidate narrowing-down unit 62 narrows a plurality of the received signal point candidates generated by the received signal point candidate generator 21 down to the received signal point candidates in which a metric calculation value by the metric calculation unit 24 is equal to or less than an arbitrary value r2 as the received signal point candidates to be used in calculation by the likelihood calculation unit 25, and the value r2 can be decreased as the number of iterations of the BICM-ID is increased.

When the received signal point candidate narrowing-down unit 62 is formed as described above, a number of the received signal point candidates to be used in a calculation in the likelihood calculation unit 25 is reduced in the case where the number of iterations of the BICM-ID is larger in comparison with the number of iterations of the BICM-ID is small. In addition, the received signal point candidates can be easily narrowed down to those to be used in likelihood calculation, and more suitable received signal point candidates can be selected as the received signal point candidate to be used in a likelihood calculation.

As described above, in the second embodiment, received signal point candidates are narrowed down such that a number of received signal point candidates to be used in a likelihood calculation is decreased as a number of iterations is increased. Then, the likelihood calculation is performed by using the narrowed-down received signal point candidates, and the first extrinsic information 60b (corresponding to the extrinsic information 15b according to the first embodiment) is output.

According to the second embodiment, at least next effect can be obtained.

(B1) A demodulator of an iterative decoding processing unit generates multiple received signal point candidates, and the generated multiple received signal point candidates are narrowed down to received signal point candidates to be used in a likelihood calculation (creation of first extrinsic information), based on a number of iterations of iterative decoding processing and a distance between the generated received signal point candidates and a received signal. Therefore, a calculation amount of the iterative decoding processing unit can be reduced. In addition, in comparison with the case where a priori information is used (the first embodiment), although deterioration of BICM-ID decoding characteristics may be increased, a demodulator can be realized by a simple hardware configuration, and also a calculation amount of the demodulator can be reduced.

Third Embodiment

A third embodiment of the present invention will be described next.

In the third embodiment, a method for reducing a hardware scale of the MIMO demodulator by using a method for reducing a calculation amount according to the first and second embodiments is provided.

The iterative decoding processing unit 19 in BICM-ID illustrated in FIG. 1 can perform iterative decoding processing for an arbitrary number of times by a single hardware. However, in the case where the iterative decoding processing is performed by a single hardware, delay by the iterative decoding processing is caused as many times as the iterative decoding processing is performed. To suppress the delay, it is effective to improve throughput of BICM-ID processing by arranging the same hardware on multiple stages in parallel. In the third embodiment, a method for reducing a circuit scale of the whole MIMO demodulator is provided in a configuration in which the BICM-ID processing is performed in parallel by using a plurality of the iterative decoding processing units 19.

Figure 7:
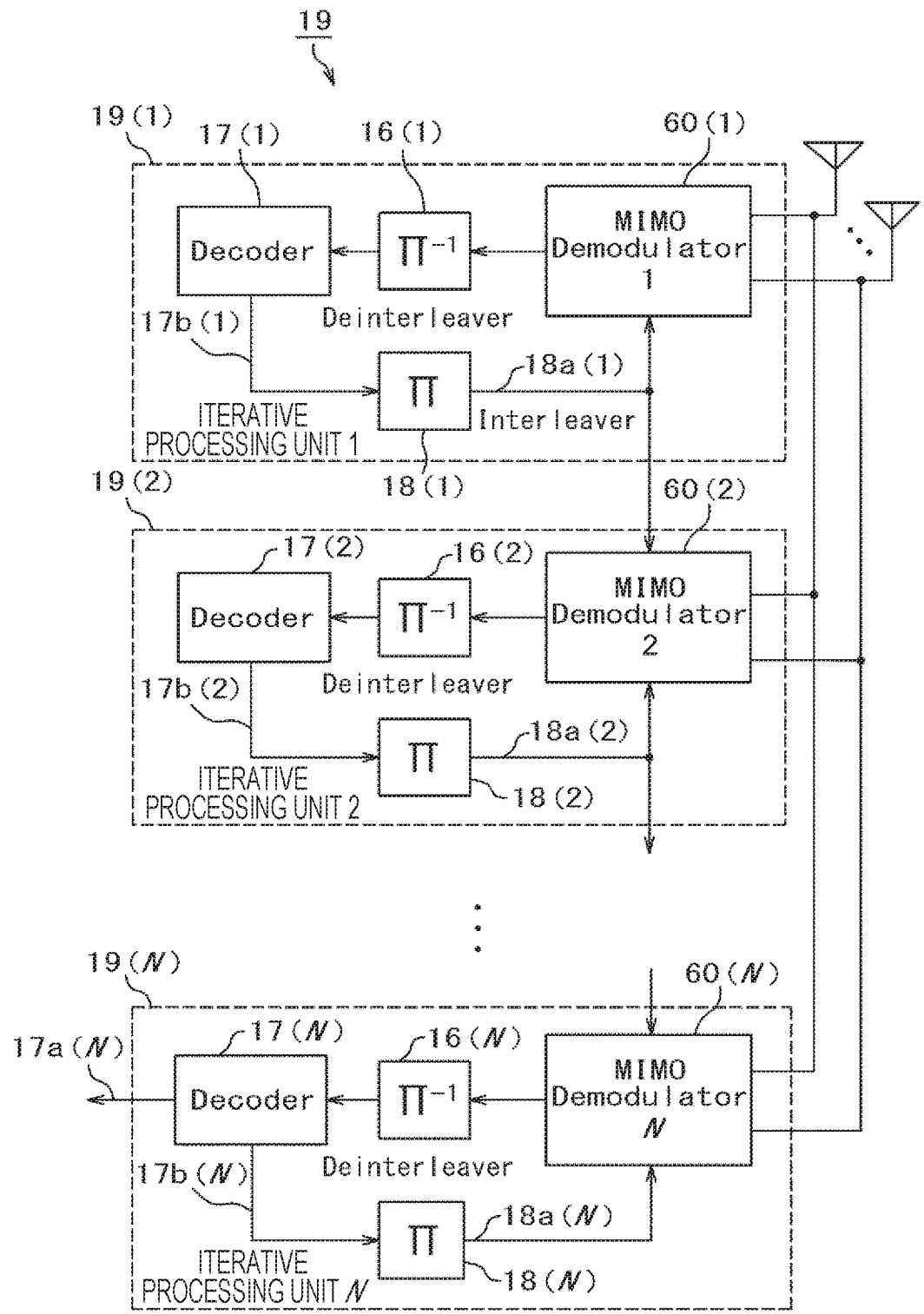
FIG. 7 is a hardware configuration of BICM-ID according to a third embodiment of the present invention.

FIG. 7 is a hardware configuration of the BICM-ID according to the third embodiment of the present invention. The iterative decoding processing unit 19 illustrated in FIG. 7 is connected to input/output units of the iterative decoding processing units 19(1) to 19(N) arranged on N stages and mounted in parallel like a pipeline. "N" is an integer equal to or larger than two. In the example illustrated in FIG. 7, the MIMO demodulators 60(1) to 60(N) according to the second embodiment are mounted to the iterative decoding processing units 19(1) to 19(N) on each stage.

Further, in the example in FIG. 7, the iterative decoding processing units 19(1) to 19(N) on each stage performs a part of the iterative decoding processing needed in BICM-ID processing of every iterative decoding processing units 19. Specifically, in the case where a number of times of the BICM-ID processing performed by every iterative decoding processing units 19 is denoted by Nitr, the iterative decoding processing unit 19(1) on a first stage performs iterative decoding processing for once to Nitr1 times, specifically, in iterative decoding processing in the whole BICM-ID, the first to Nitr1-th processing are performed. The iterative decoding processing unit 19(2) on the second stage performs (Nitr1+1)th to Nitr2-th iterative decoding processing. The iterative decoding processing unit 19(N) on the Nth stage performs (Nitr(N−1)+1)th to NitrN-th iterative decoding processing.

The iterative decoding processing units 19 on each stage records a number of iterations of iterative decoding processing to be performed on the stage in a recording unit, and when the iterative decoding processing unit performs the processing for the set number of times recorded in the recording unit, the fourth extrinsic information 18a which is output from an interleaver 18 on its stage is transmitted to the MIMO demodulator 60 of the iterative decoding processing unit 19 on the next stage.

For example, the iterative decoding processing unit 19(1) on the first stage performs iterative decoding processing for once to Nitr1 times with respect to a codeword $C_1$ including four bit received signals (b0 to b3), and when a number of the times of the iterative decoding processing is reached to the set value on the first stage (Nitr1) recorded in the recording unit, fourth extrinsic information 18a (1) output from an interleaver 18(1) is transmitted to the MIMO demodulator 60(2) of the iterative decoding processing unit 19(2) on the next stage (second state).

When the iterative decoding processing unit 19(2) on the second stage receives the fourth extrinsic information 18a(1) from the previous stage (first stage), (Nitr1+1)th to Nitr2-th iterative decoding processing regarding the codeword $C_1$ is performed by using the fourth extrinsic information 18a(1) as a priori information, and when the number of iterations of the iterative decoding processing on the second stage reaches to the set number of iterations (Nitr2−Nitr1) recorded in the recording unit, fourth extrinsic information 18a(2) output from an interleaver 18(2) is transmitted to the MIMO demodulator 60 of the iterative decoding processing unit 19 on the next stage.

As described above, in the iterative decoding processing units 19(1) to 19(N) on each stage, iterative decoding processing regarding the codeword $C_1$ is performed subsequently. Then, the iterative decoding processing unit 19(N) on the final stage (Nth stage) performs (Nitr(N−1)+1)th to NitrN-th iterative decoding processing, and the final decoding output 17a(N) regarding the received signals (b0 to b3) forming the codeword $C_1$ is output.

Figure 8:
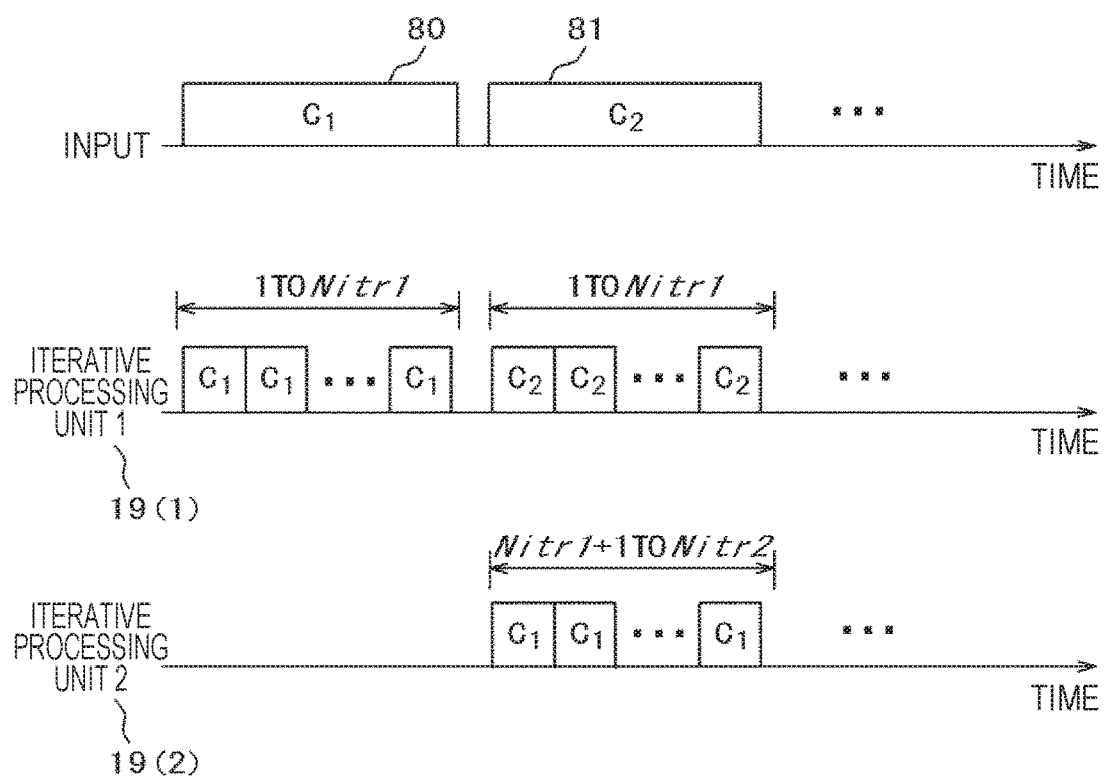
FIG. 8 is a diagram illustrating a flow of signal processing according to the third embodiment of the present invention.

FIG. 8 is a diagram illustrating a flow of signal processing when an iterative decoding processing unit is pipelined according to the third embodiment. In FIG. 8, the iterative decoding processing unit 19(1) on the first stage performs iterative decoding processing for once to Nitr1 times with respect to the codeword $C_1$ which is a processing unit of the iterative decoding processing, and after the iterative decoding processing of the codeword $C_1$ is finished, iterative decoding processing is performed to a next codeword $C_2$ for once to Nitr1 times. In this manner, the iterative decoding processing unit 19(1) subsequently performs iterative decoding processing for once to Nitr1 times with respect to the codewords $C_1, C_2 \ldots$.

After the iterative decoding processing unit 19(1) finishes iterative decoding processing with respect to the codeword $C_1$, the iterative decoding processing unit 19(2) on the second stage performs (Nitr1+1)th to Nitr2-th iterative decoding processing to the codeword $C_1$.

As described above, the iterative decoding processing unit 19 is pipelined, and when the iterative decoding processing unit 19(2) on the second stage performs (Nitr1+1)th to Nitr2-th iterative decoding processing with respect to the first codeword $C_1$, the iterative decoding processing unit 19(1) on the first stage performs first to Nitr1-th iterative decoding processing with respect to the second codeword $C_2$. Similarly, when the iterative decoding processing unit 19(2) on the second stage performs (Nitr1+1)th to Nitr2-th iterative decoding processing with respect to the second codeword $C_2$, the iterative decoding processing unit 19(1) on the first stage performs first to Nitr1-th iterative decoding processing with respect to the third codeword $C_3$.

In this manner, in the iterative decoding processing units 19(1) to 19(N) on each stage, iterative decoding processing is performed in parallel. Therefore, the iterative decoding processing units 19(1) to 19(N) on each stage can reduce at least a processing amount of the received signal point candidate narrowing-down unit 62 on each stage, specifically a hardware scale of the received signal point candidate narrowing-down unit 62.

As described above, in the third embodiment, a number of iterations and an order of iterative decoding processing of each iterative decoding processing unit is set such that each of the N iterative decoding processing units 19(1) to 19(N) shares the iterative decoding processing for n times (n: an integer equal to or larger than two) performed by a receiver. When a number of times of the iterative decoding processing set to the first iterative decoding processing unit is finished, a priori information output from the first iterative decoding processing unit is output to the second iterative decoding processing unit which performs the iterative decoding processing next to the first iterative decoding processing unit. The second iterative decoding processing unit performs the iterative decoding processing by inputting the a priori information output from the first iterative decoding processing unit to a demodulator of the second iterative decoding processing unit.

According to the third embodiment, at least next effect can be obtained.

(C1) A magnitude of a a priori information amount can be estimated by a number of iterations of iterative decoding processing, and in the above-described N iterative decoding processing units 19(1) to 19(N) can be realized by hardware in which a number of received signal point candidates to be used in a likelihood calculation is more reduced in the iterative decoding processing units closer to the iterative decoding processing unit 19(N), specifically the units on a later stage. Therefore, in the MIMO demodulators 60(1) to 60(N) of the iterative decoding processing unit 19 having a pipelined configuration, a hardware scale can be reduced on the later stage, and a hardware scale of the whole BICM-ID processing can be reduced.

The present invention is not limited to the above-described embodiments and can be changed within a range of the gist of the present invention.

In the above-described first to third embodiments, as a modulator on a transmission side and a demodulator on a receiving side, each of a MIMO modulator and a MIMO demodulator is used. However, the present invention is applicable to a modulator other than the MIMO modulator and a demodulator other than the MIMO demodulator.

REFERENCE SIGNS LIST 10 encoder
11 interleaver
12 MIMO modulator
12a antenna
14 wireless propagation path (wireless channel)
14a channel information
15 MIMO demodulator
51
15a antenna
15b first extrinsic information
16 deinterleaver
16a second extrinsic information
17 decoder
17a final decoder output
17b third extrinsic information
18 interleaver
18a fourth extrinsic information
19 iterative decoding processing unit
20 transmission signal point candidate generator
21 received signal point candidate generator
22 received signal point candidate narrowing-down unit
23 matrix calculation unit
24 metric calculation unit
25 likelihood calculation unit
30 received signal point
31 received signal point candidate
40 received signal point candidate on highest layer
41 received signal point candidate on second layer
60 MIMO demodulator
62 received signal point candidate narrowing-down unit

The invention claimed is:
1. A receiver, comprising:
a multiple input multiple output (MIMO) demodulator configured to receive a signal encoded and interleaved on a transmission side using bit interleaved coded modulation (BICM), create first extrinsic information by using the received signal and a priori information, and output the first extrinsic information;
a deinterleaver configured to perform deinterleave processing inverse to the interleave processing on the first extrinsic information received from the MIMO demodulator and output second extrinsic information;
a decoder configured to create third extrinsic information by using the second extrinsic information and output the third extrinsic information; and
an interleaver configured to perform interleave processing inverse to the deinterleave processing on the third extrinsic information and output fourth extrinsic information,
wherein the receiver performs iterative decoding processing by inputting the fourth extrinsic information as the a priori information to the MIMO demodulator, the MIMO demodulator comprising:
a received signal point candidate generator configured to generate a plurality of received signal point candidates;
a received signal point candidate narrowing-down unit configured to narrow a plurality of the generated received signal point candidates down to received signal point candidates to be used to create the first extrinsic information, based on a magnitude of the a priori information and a distance between a plurality of the received signal point candidates generated by the received signal point candidate generator and the signal received by the MIMO demodulator; and
a likelihood calculation unit configured to create the first extrinsic information based on the narrowed-down received signal point candidates, the a priori information, and the received signal.

2. The receiver according to claim 1, wherein the received signal point candidate narrowing-down unit determines a number of received signal point candidates to be used to create the first extrinsic information based on a magnitude of the a priori information, and the received signal point candidate narrowing-down unit determines received signal point candidates to be used to create the first extrinsic information based on a distance between the plurality of the received signal point candidates generated by the received signal point candidate generator and the signal received by the MIMO demodulator.

3. The receiver according to claim 1, wherein
the MIMO demodulator comprises a metric calculation unit configured to calculate a metric calculation value based on the received signal point candidates generated by the received signal point candidate generator and the received signal, and
the received signal point candidate narrowing-down unit uses the metric calculation value as the distance between the plurality of the received signal point candidates generated by the received signal point candidate generator and the signal received by the MIMO demodulator.

4. The receiver according to claim 1, wherein
as received signal point candidates to be used to create the first extrinsic information, the received signal point candidate narrowing-down unit narrows the plurality of the received signal point candidates generated by the received signal point candidate generator down to received signal point candidates in which a distance between the signal received by the MIMO demodulator is equal to or less than an arbitrary value r1, and
a number of the received signal point candidates to be used to create the first extrinsic information is reduced by decreasing the value r1 as a magnitude of the a priori information is increased.

5. The receiver according to claim 1, wherein
the MIMO demodulator comprises a metric calculation unit configured to calculate a metric calculation value based on the received signal point candidates generated by the received signal point candidate generator and the received signal,
the received signal point candidate narrowing-down unit narrows the received signal point candidates down to those in which the calculated metric calculation value is equal to or less than an arbitrary value r2, as received signal point candidates to be used to create the first extrinsic information, and a number of the received signal point candidates to be used to create the first extrinsic information is reduced by decreasing the value r2 as a magnitude of the a priori information is increased.

6. The receiver according to claim 1, wherein
the received signal point candidate narrowing-down unit determines a magnitude of the a priori information based on a mutual information of the a priori information or determines the magnitude based on an average value of an absolute value, a variance, a standard deviation, a maximum value, a mode value, or a median value which are a statistic of the a priori information.

7. A receiver, comprising:
a multiple input multiple output (MIMO) demodulator configured to receive a signal encoded and interleaved on a transmission side using bit interleaved coded modulation (BICM), create first extrinsic information by using the received signal and a priori information, and output the first extrinsic information;
a deinterleaver configured to perform deinterleave processing inverse to the interleave processing on the first extrinsic information and output second extrinsic information;
a decoder configured to create third extrinsic information by using the second extrinsic information as a priori information and output the third extrinsic information; and
an interleaver configured to perform interleave processing inverse to the deinterleave processing on the third extrinsic information and output a fourth extrinsic information,
wherein the receiver performs iterative decoding processing by inputting the fourth extrinsic information as the a priori information to the MIMO demodulator, the MIMO demodulator comprising:
a received signal point candidate generator configured to generate a plurality of received signal point candidates;
a received signal point candidate narrowing-down unit configured to narrow a plurality of the generated received signal point candidates down to received signal point candidates to be used to create the first extrinsic information, based on a number of iterations of the iterative decoding processing and a distance between a plurality of the received signal point candidates generated by the received signal point candidate generator and the signal received by the MIMO demodulator; and
a likelihood calculation unit configured to create the first extrinsic information based on the narrowed-down received signal point candidates, the a priori information, and the received signal.

8. The receiver according to claim 7, wherein the received signal point candidate narrowing-down unit determines a number of received signal point candidates to be used to create the first extrinsic information based on a processing frequency of the iterative decoding processing, and the received signal point candidate narrowing-down unit determines received signal point candidates to be used to create the first extrinsic information based on a distance between the plurality of the received signal point candidates generated by the received signal point candidate generator and the signal received by the MIMO demodulator.

9. The receiver according to claim 7, wherein the MIMO demodulator comprises a metric calculation unit configured to calculate a metric calculation value based on the received signal point candidates generated by the received signal point candidate generator and the received signal, and
the received signal point candidate narrowing-down unit uses the calculated metric calculation value as the distance between the plurality of the received signal point candidates generated by the received signal point candidate generator and the signal received by the MIMO demodulator.

10. The receiver according to claim 7, wherein, as received signal point candidates to be used to create the first extrinsic information, the received signal point candidate narrowing-down unit narrows the plurality of the received signal point candidates generated by the received signal point candidate generator down to received signal point candidates, in which a distance between the signal received by the MIMO demodulator is equal to or less than an arbitrary value r1, and
a number of the received signal point candidates to be used to create the first extrinsic information is reduced by decreasing the value r1 as the number of iterations of the iterative decoding processing is increased.

11. The receiver according to claim 7, wherein the MIMO demodulator comprises a metric calculation unit configured to calculate a metric calculation value based on the received signal point candidates generated by the received signal point candidate generator and the received signal,
the received signal point candidate narrowing-down unit narrows the received signal point candidates down to those in which the calculated metric calculation value is equal to or less than an arbitrary value r2, as received signal point candidates to be used to create the first extrinsic information, and
a number of the received signal point candidates to be used to create the first extrinsic information is reduced by decreasing the value r2 as the number of iterations of the iterative decoding processing is increased.

12. A receiver, comprising:
a multiple input multiple output (MIMO) demodulator configured to receive a signal encoded and interleaved on a transmission side using bit interleaved coded modulation (BICM), create first extrinsic information by using the received signal and a priori information, and output the first extrinsic information;
a deinterleaver configured to perform deinterleave processing inverse to the interleave processing on the first extrinsic information and output the second extrinsic information;
a decoder configured to create third extrinsic information by using a second extrinsic information and output the third extrinsic information; and
an interleaver configured to perform interleave processing inverse to the deinterleave processing on the third extrinsic information and output fourth extrinsic information,
wherein the receiver comprises N iterative decoding processing units (N is an integer equal to or larger than 2) configured to perform iterative decoding processing by inputting the fourth extrinsic information as the a priori information to the MIMO demodulator, and
an order and a number of iterations of the iterative decoding processing in each iterative decoding processing unit is set such that the N iterative decoding processing units share n times iterative decoding processing performed by the receiver (n is an integer equal to or larger than 2), after the number of times of the iterative decoding processing set for a first iterative decoding processing unit is completed, the a priori information output from the first iterative decoding processing unit is output to a second iterative decoding processing unit which performs the iterative decoding processing next to the first iterative decoding processing unit, and the second iterative decoding processing unit performs the iterative decoding processing by inputting the a priori information output from the first iterative decoding processing unit to a MIMO demodulator of the second iterative decoding processing unit.

* * * * *